United States Patent

Kim et al.

[11] Patent Number: 5,923,183
[45] Date of Patent: Jul. 13, 1999

[54] CMOS OUTPUT BUFFER CIRCUIT EXHIBITING REDUCED SWITCHING NOISE

[75] Inventors: Seong-Won Kim; Min-Kyu Song; Eu-Ro Joe, all of Seoul; Geun-Soon Kang, Boochun-shi, all of Rep. of Korea

[73] Assignee: Samsung Electronics Co., Ltd., Suwon, Rep. of Korea

[21] Appl. No.: 08/826,509

[22] Filed: Apr. 3, 1997

[30] Foreign Application Priority Data

Apr. 4, 1996 [KR] Rep. of Korea ............... 96-10133

[51] Int. Cl.[6] ............... H03K 17/16; H03K 19/0185
[52] U.S. Cl. ............... 326/27; 326/58; 326/86; 326/87
[58] Field of Search ............... 326/27–28, 56–58, 326/83, 86, 87

[56] References Cited

U.S. PATENT DOCUMENTS

| | | | |
|---|---|---|---|
| 4,719,369 | 1/1988 | Ason et al. | 326/87 |
| 5,122,690 | 6/1992 | Bianchi | 326/87 |
| 5,166,555 | 11/1992 | Kano | 326/87 |
| 5,534,791 | 7/1996 | Mattos et al. | 326/58 |
| 5,537,060 | 7/1996 | Baek | 326/87 |

*Primary Examiner*—Jon Santamauro
*Assistant Examiner*—Don Phu Le
*Attorney, Agent, or Firm*—Jones, Volentine, Steinberg & Whitt, L.L.P.

[57] ABSTRACT

A CMOS output buffer circuit includes a predriving circuit which generates two predriving signals, a main driving circuit which has a plurality of parallel connected pull-up transistors and a plurality of parallel connected pull-down transistors, and a sequential driving circuit which provides sequential pull-up and pull-down driving signals to the pull-up and pull-down transistors, respectively. The main driving circuit generates the output signal according to the sequential pull-up or pull-down driving signals, whereby the output signal is developed step by step into either the power supply potential or the ground potential. In the manner, any spike in the switching current is considerably mitigated, thereby reducing switching noise.

17 Claims, 6 Drawing Sheets

CMOS OUTPUT BUFFER CIRCUIT EXHIBITING REDUCED SWITCHING NOISE

BACKGROUND OF THE INVENTION

1. Field of the Invention

The present invention relates to a complementary metal oxide semiconductor (CMOS) output buffer circuit for use in a semiconductor device, more particularly to a CMOS output buffer circuit having improved power and ground noise characteristics.

2. Description of the Related Art

As the operating frequencies of semiconductor devices have increased, the output switching speeds thereof have also increased, which translates into reduced rise/fall times and pulse widths. Also, any increase in output switching speed increases the rate of change of the switching current. Due to chip-package interface power distribution parasitics, switching noise is created when output buffer circuits switch simultaneously.

FIG. 1 is a circuit diagram showing a conventional CMOS output buffer circuit. Referring to FIG. 1, the output buffer 100 is composed of two CMOS inverter stages 110 and 120 connected in series between an input terminal 101 and an output terminal 102. A data signal from an internal circuit of the semiconductor chip is applied to the input terminal 101. A CMOS inverter circuit 110 of a first stage comprises a P-channel MOS transistor MP11 and an N-channel MOS transistor MN11. Gates of the transistors MP11 and MN11 are connected to the input terminal 101 and drains thereof are connected to each other. Sources of the transistors MP11 and MN11 are connected to a power supply potential $V_{DD}$ and a ground potential $V_{SS}$, respectively.

Also, a CMOS inverter circuit 120 of a second stage comprises a P-channel MOS transistor MP12 and an N-channel MOS transistor MN12. Gates of the transistors MP12 and MN12 are connected to the drains of the transistors MP11 and MN11, and drains thereof are connected to the output terminal 102. Sources of the transistors MP12 and MN12 are connected to the power supply potential $V_{DD}$ and the ground potential $V_{SS}$, respectively.

Since a semiconductor chip of a semiconductor device is generally packaged, the output buffer circuit included in the semiconductor chip is connected to an external circuit by means of a lead frame. It is assumed that the lead frame has an inductance 'L' and the switching time of the output buffer is 't'. If a current 'I', which flows through transistor MP12 or MN12, varies, noise voltage '$V_N$' is generated at the output terminal 102 at a rate expressed by the following formula.

$$V_N = L \times \frac{di}{dt} \quad (1)$$

In formula (1), di/dt denotes a variation in the current 'I' with respect to time.

In the above arrangement, since in general the output buffer should drive a large amount of current, as shown in FIG. 6B, a peak noise caused by a spike of switching current occurs on the output terminal of the buffer at the beginning of the switching operation or when the voltage of the output terminal starts to change. The switching noise is generated by an increase in the current flowing to a power supply terminal to charge a parasitic capacitive load at the output terminal of the buffer.

Therefore, in order to design a semiconductor device of high speed and reliability, it is essential that at any given arbitrary time the switching noise must be limited to within a maximum allowable noise level. Unless power and ground noises are controlled, reliable operation of logic circuits that are connected to the same power supply potential $V_{DD}$ and ground potential $V_{SS}$ can not be guaranteed. Some of the problems associated with switching noise induced operational errors include 1) false triggering, 2) double clocking, and/or 3) missing clocked pulses.

SUMMARY OF THE INVENTION

It is therefore an object of the present invention to provide a CMOS output buffer used in a semiconductor integrated circuit, which mitigates any spiking of the switching current flowing during the level transition of an input signal, an thus reduces the switching noise.

According to an aspect of the present invention, there is provided a CMOS output buffer circuit comprising: a pre-driving circuit which receives an input signal and an enable signal, and which generates a first predriving signal and a second predriving signal responsive to the input signal and the enable signal; a sequential driving circuit which receives the first predriving signal and an output signal at an output terminal, and which generates a plurality of first sequential driving signals in order when the ouput signal is at a first logic level and a plurality of second sequential driving signals in order when the output signal is at a second logic level; and a main driving circuit which receives the first and second predriving signals and the first and second sequential signals, and which generates the output signal as either one of the first logic level and the second logic level responsive to the first and second predriving signals and the first and second sequential driving signals.

Therefore, the output signal of the output buffer circuit according to this aspect is developed step by step into either the first logic level or the second logic level, that is, the switching current thereof is distributed with respect to time, thereby mitigating spiking of the switching current. This reduces the switching noise of the output buffer circuit.

In a preferred embodiment, the main driving circuit comprises: a pull-up driver responsive to the first predriving signal and the first sequential driving signals, for making a step-by-step transition of the output signal from a ground potential to a power supply potential; and a pull-down driver responsive to the second predriving signal and the second sequential driving signals, for making a step-by-step transition of the output signal from the power supply potential to the ground potential.

According to another aspect of the present invention, there is provided a CMOS output buffer circuit comprising: a first circuit for receiving an input signal and enable signal and generating a first predriving signal and a second predriving signal; a second circuit for receiving the first predriving signal and the output signal and sequentially generating a plurality of first sequential driving signals at predetermined intervals when the input signal is at a first logic level, and sequentially generating a plurality of second sequential driving signals at the predetermined intervals when the input signal is at a second logic level; and a third circuit for receiving the first and second predriving signals and the first and second sequential driving signals and for generating an output signal at an output terminal, wherein said third circuit includes a plurality of first conductivity type MOS transistors which have current paths connected in parallel between a power supply potential and said output terminal and control terminals respectively receiving the first predriving signals and the first sequential driving signals, and a plurality of second conductivity type MOS transistors which have current paths connected in parallel between said output terminal and a ground potential and control terminals respectively receiving the second predriving and the second sequential driving signals, wherein the output terminal is either gradually charged up to the power supply potential or gradually discharged into the ground potential by the first and second conductivity type MOS transisitors.

The output terminal of the output buffer according to this aspect of the invention is either charged up to the power supply potential or discharged to the ground potential gradually, and consequently, the switching noise of the output buffer circuit is reduced.

BRIEF DESCRIPTION OF THE DRAWINGS

The foregoing features and advantages of the invention will be more fully understood from the description that follows with reference to the accompanying drawings, in which the present invention is illustrated by way of example, and not by way of limitation, in which like reference numerals refer to similar elements, and in which.

DETAILED DESCRIPTION OF THE PREFERRED EMBODIMENTS

The following detailed description is of the best mode presently contemplated by the inventors for practicing the invention. It should be understood that the description of this preferred embodiment is merely illustrative, and that it should not be taken in a limiting sense.

Figure 1:
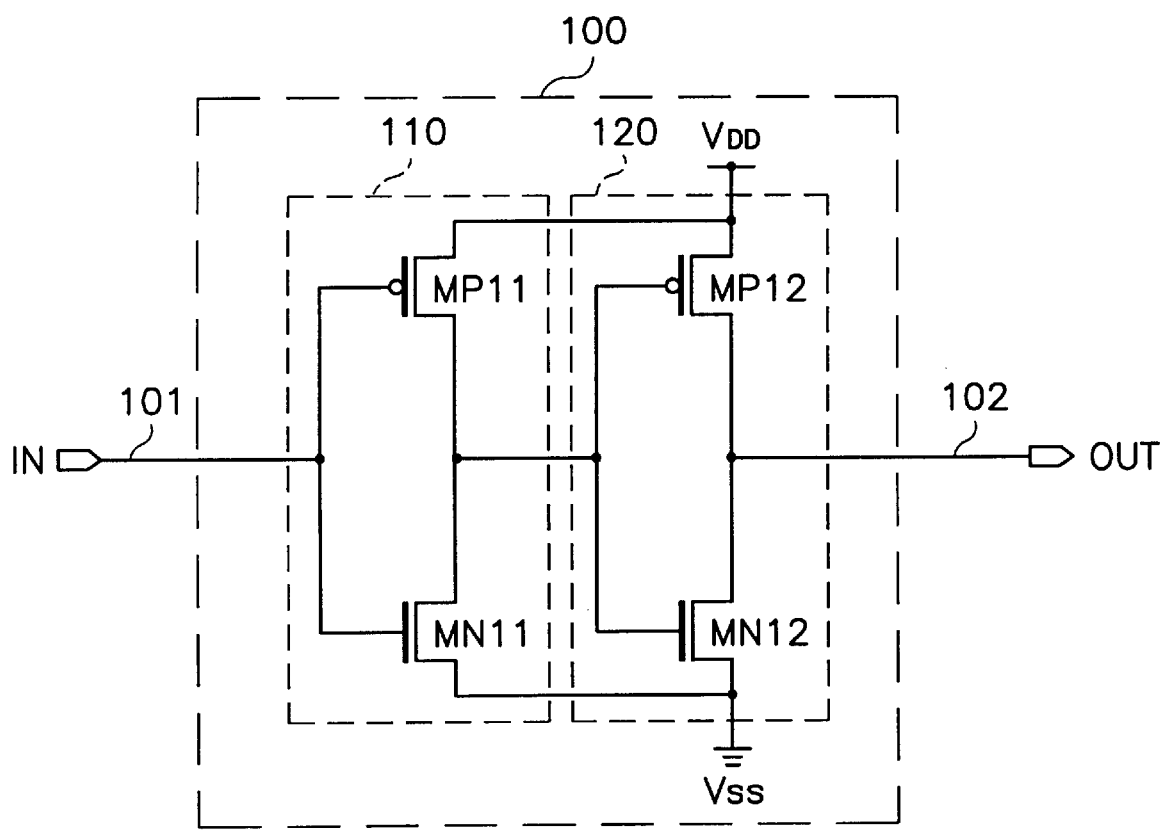
FIG. 1 is a circuit diagram showing an arrangement of a conventional CMOS output buffer circuit used in a semiconductor integrated circuit.
Figure 2:
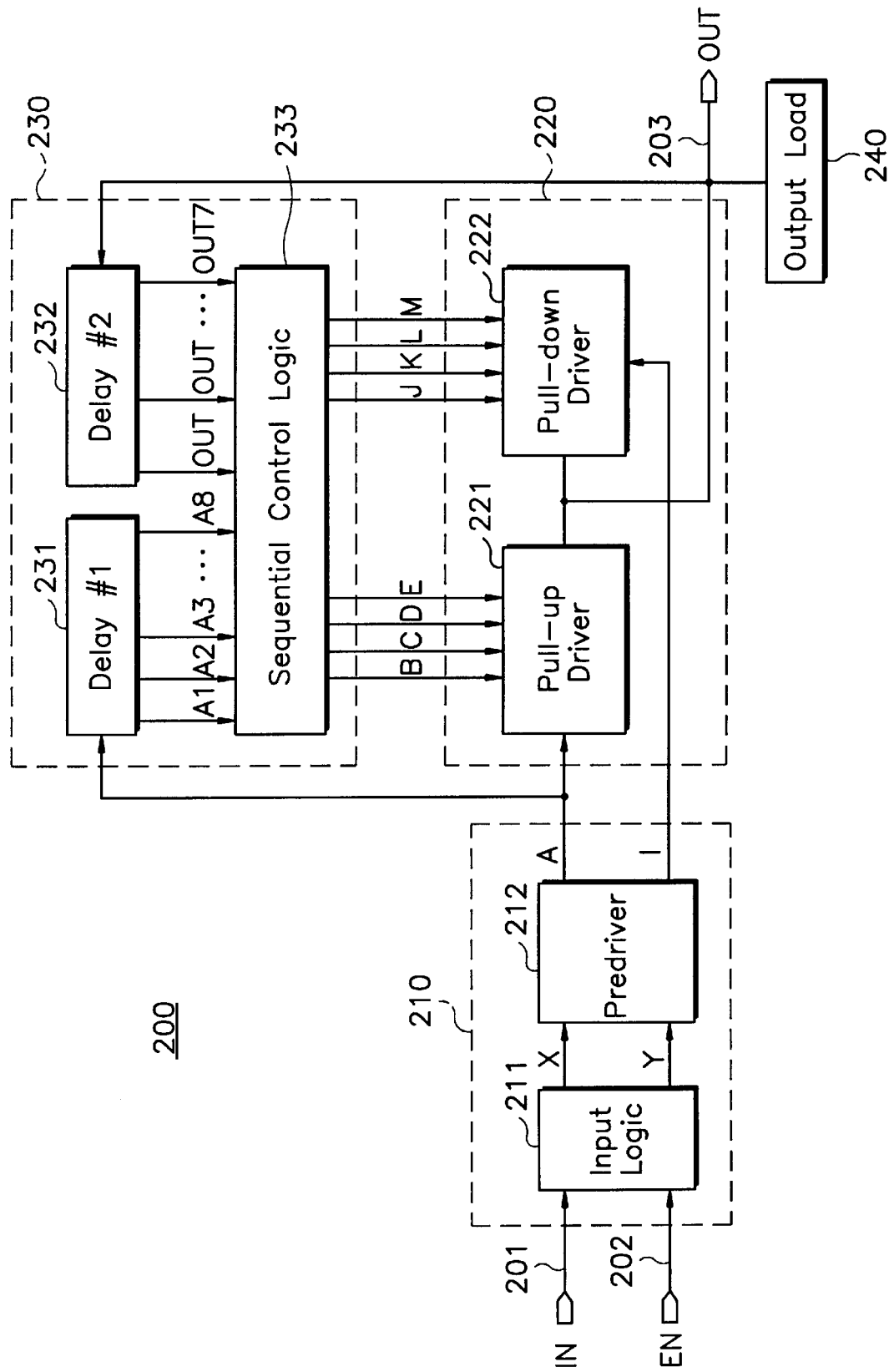
FIG. 2 is a block diagram showing an arrangement of a CMOS output buffer circuit according to a preferred embodiment of the present invention.

FIG. 2 is a block diagram showing an arrangement of a CMOS output buffer circuit according to a preferred embodiment of the present invention. Referring to FIG. 2, the output buffer circuit 200 comprises a predriving circuit 210, a main driving circuit 220 and a sequential driving circuit 230.

The predriving circuit 210 receives an input signal IN and an enable signal EN, which are applied to an input terminal 201 and an enable terminal 202 respectively, so as to generate two predriving signals A and I. The predriving circuit 210 comprises an input logic section 211 which receives the input signal IN and the enable signal EN to generate two logic signals X and Y, and a predriver section 212 which receives the logic signals X and Y to generate the predriving signals A and I. The predriving signals A and I are applied to the main driving circuit 220.

Then, the main driving circuit 220 starts to generate an output signal OUT at an output terminal 203 in response to the predriving signals A and I. The main driving circuit 220 comprises a pull-up driver section 221 which makes a step-by-step transition of the output signal OUT from the ground potential $V_{SS}$ to the power supply potential $V_{DD}$, and a pull-down driver section 222 which makes a step-by-step transition of the output signal OUT from the power supply potential $V_{DD}$ to the ground potential $V_{SS}$. The predriving signal A and the output signal OUT are applied to the sequential driving circuit 230.

The sequential driving circuit 230 comprises a first delay section 231 which receives the predriving signal A and generates a set of first delay signals A1, A2, ..., A8 in this order, a second delay section 232 which receives the output signal OUT and sequentially generates a set of second delay signals OUT1, OUT2, ..., OUT7, and a sequential control logic section 233 which receives the delay signals and generates four sequential pull-up driving signals and four sequential pull-down driving signals. More particularly, the sequential driving circuit 230 generates the sequential pull-up driving signals B, C, D and E in this order when the input signal IN goes to a logically high (or low) level. The sequential driving circuit 230 also generates the sequential pull-down driving signals J, K, L and M in this order when the input signal IN goes to a logically low (or high) level. Thus, the main driving circuit 220 drives the output signal OUT according to the sequential pull-up or pull-down driving signals, so that the output signal OUT is developed step by step to either the high level or the low level.

Figure 3:
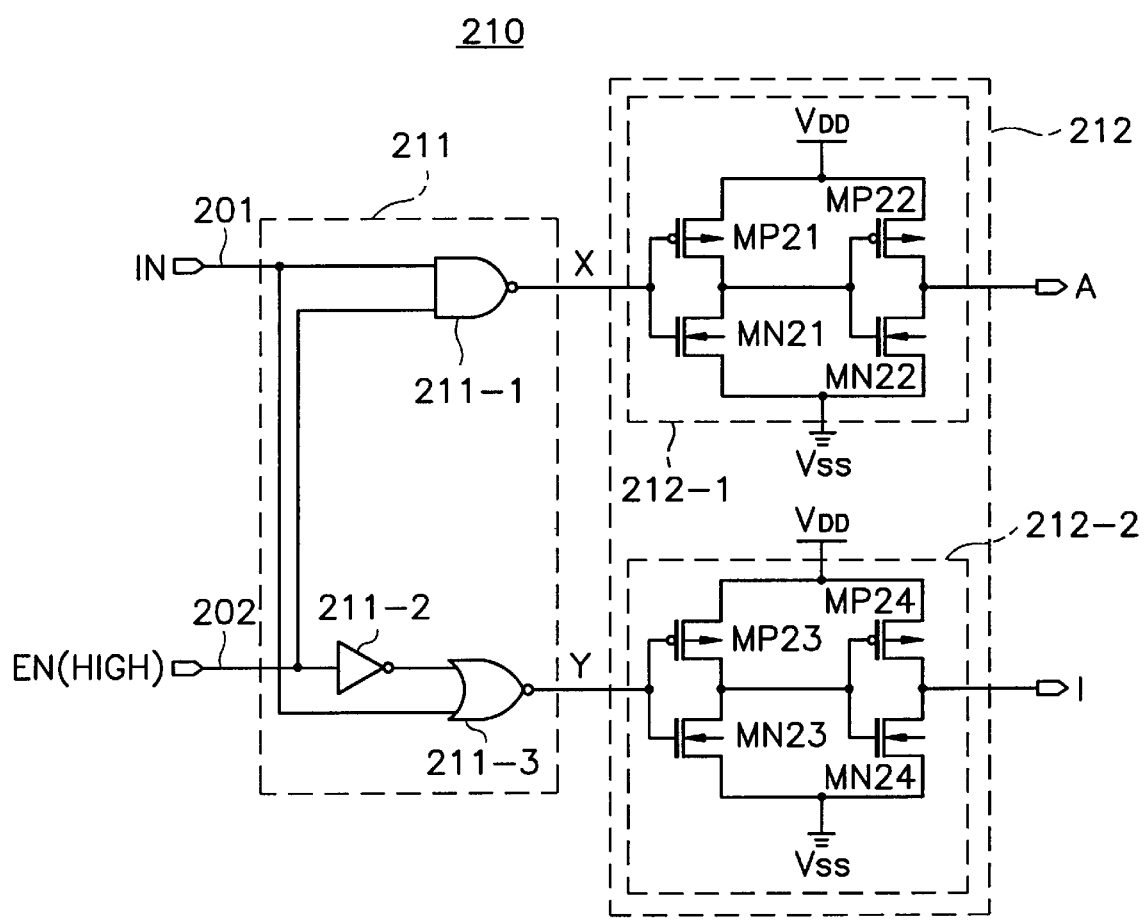
FIG. 3 is a detailed circuit diagram of a predriving circuit shown in FIG. 2.

FIG. 3 is a detailed circuit diagram of the predriving circuit 210 shown in FIG. 2. As shown in FIG. 3, The input logic section 211 includes a NAND gate circuit 211-1 which receives the input signal IN and the enable signal EN to generate the logic signal X, an inverter circuit 211-2 which receives the enable signal EN to invert its logic level, and a NOR gate circuit 211-3 which receives the input signal IN and the output of the inverter circuit 211-2 to generate the logic signal Y.

When both the input signal IN and the enable signal EN are at the high level, the input logic section 211 generates the logic signals X and Y as low level signals. When the input signal IN is at the low level and the enable signal EN is at the high level, the input logic section 211 generates the logic signals X and Y as high level signals. When the enable signal EN is low (regardless of the state of the input signal IN), the logic section 211 generates the logic signal X as a high level signal and the logic signal Y as a low level signal.

The predriver section 212 includes two predrivers 212-1 and 212-2 which generate the predriving signals A and I in response to the logic signals X and Y, respectively. In some cases, however, the logic signals X and Y may be used directly as the predriving signals A and I, respectively.

The predriver 212-1 has two P-channel MOS transistors MP21 and MP22, and two N-channel MOS transistors MN21 and MN22. Sources of the P-channel MOS transistors MP21 and MP22 are connected to a power supply potential $V_{DD}$, and sources of the N-channel MOS transistors MN21 and MN22 are connected to a ground potential $V_{SS}$. Gates of the transistors MP21 and MN21 (which form a CMOS inverter circuit) are connected to the output of the NAND gate 211-1, and drains thereof are connected to each other. Gates of the transistors MP22 and MN22 (which also form a CMOS inverter circuit) are connected to the drains of the transistors MP21 and MN21, and drains thereof are connected to each other. The predriving signal A is produced from the drains of the transistors MP22 and MN22.

The predriver 212-2 also has two P-channel MOS transistors MP23 and MP24, and two N-channel MOS transistors MN23 and MN24. Sources of the P-channel MOS transistors MP23 and MP24 are connected to the power supply potential $V_{DD}$, and sources of the N-channel MOS transistors MN23 and MN24 are connected to the ground potential $V_{SS}$. Gates of the transistors MP23 and MN23 (which form a CMOS inverter circuit) are connected to the output of the NOR gate 211-3, with the drains thereof being connected to each other. Gates of the transistors MP24 and MN24 (which form a CMOS inverter circuit) are connected to the drains of the transistors MP23 and MN23, with the drains thereof being connected to each other. The predriving signal I is generated from the drains of the transistors MP24 and MN24.

When both the input signal IN and the enable signal EN are high, the predrivers 212-1 and 212-2 generate the predriving signals A and I at the ground potential $V_{SS}$. When the input signal IN is low and the enable signal EN is high, the predrivers 212-1 and 212-2 generate the predriving signals A and I at the power supply potential $V_{DD}$. On the other hand, when the enable signal EN is low (regardless of the state of the input signal IN), the predrivers 212-1 and 212-2 generate the predriving signal A at the power supply potential $V_{DD}$ and the predriving signal I at the ground potential $V_{SS}$.

Figure 4:
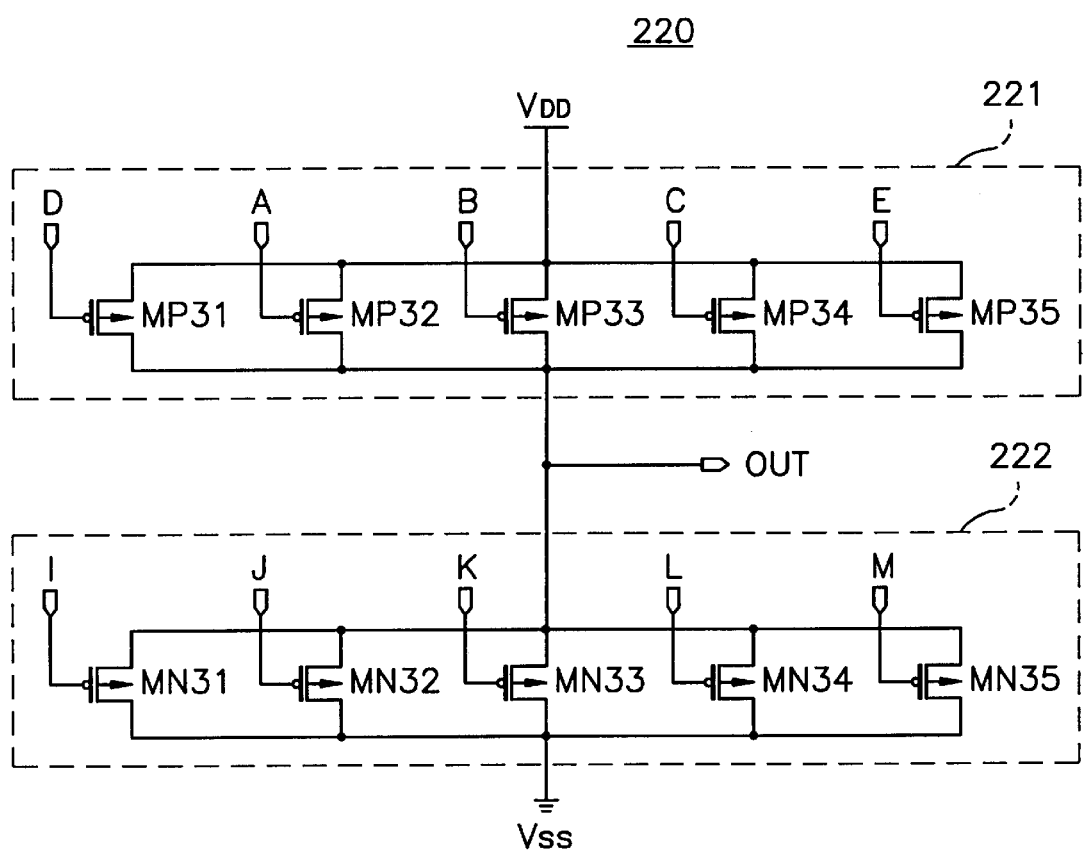
FIG. 4 is a detailed circuit diagram of a main driving circuit shown in FIG. 2.

FIG. 4 shows a detailed arrangement of the main driving circuit 220 of FIG. 2. As shown in FIG. 4, the pull-up driver section 221 includes five P-channel MOS transistors MP31, MP32, MP33, MP34 and MP35 whose source-drain channels (i.e, current paths) are connected in parallel between the power supply potential $V_{DD}$ and the output terminal 203. The predriving signal A and the sequential pull-up driving signals B, C, D and E are applied to gates of the transistors MP32, MP33, MP34, MP31 and MP35, respectively. The current driving ability (or size) of the respective transistors MP31, MP32, MP33, MP34 and MP35 is about one fifth of that of the typical pull-up transistor.

The pull-down driver section 222 includes five N-channel MOS transistors MN31, MN32, MN33, MN34 and MN35 whose current paths are connected in parallel between the output terminal 203 and the ground potential $V_{SS}$. The predriving signal I and the sequential pull-down driving signals J, K, L and M are applied to gates of the transistors MN31, MN32, MN33, MN34 and MN35, respectively. The respective transistors MN31, MN32, MN33, MN34 and MN35 have about one fifth the current driving ability of the typical pull-down transistor.

When the input signal IN and the enable signal EN are high, the P-channel MOS transistor MP32 controlled by the predriving signal A is turned on, so that the output terminal 203 begins to be charged quickly, compared with the conventional output buffer. To the contrary, when the input signal IN is low and the enable signal EN is high, the N-channel MOS transistor MN31 controlled by the predriving signal I is turned on, so that the output terminal 203 quickly starts to discharge, compared to the conventional output buffer.

Figure 5:
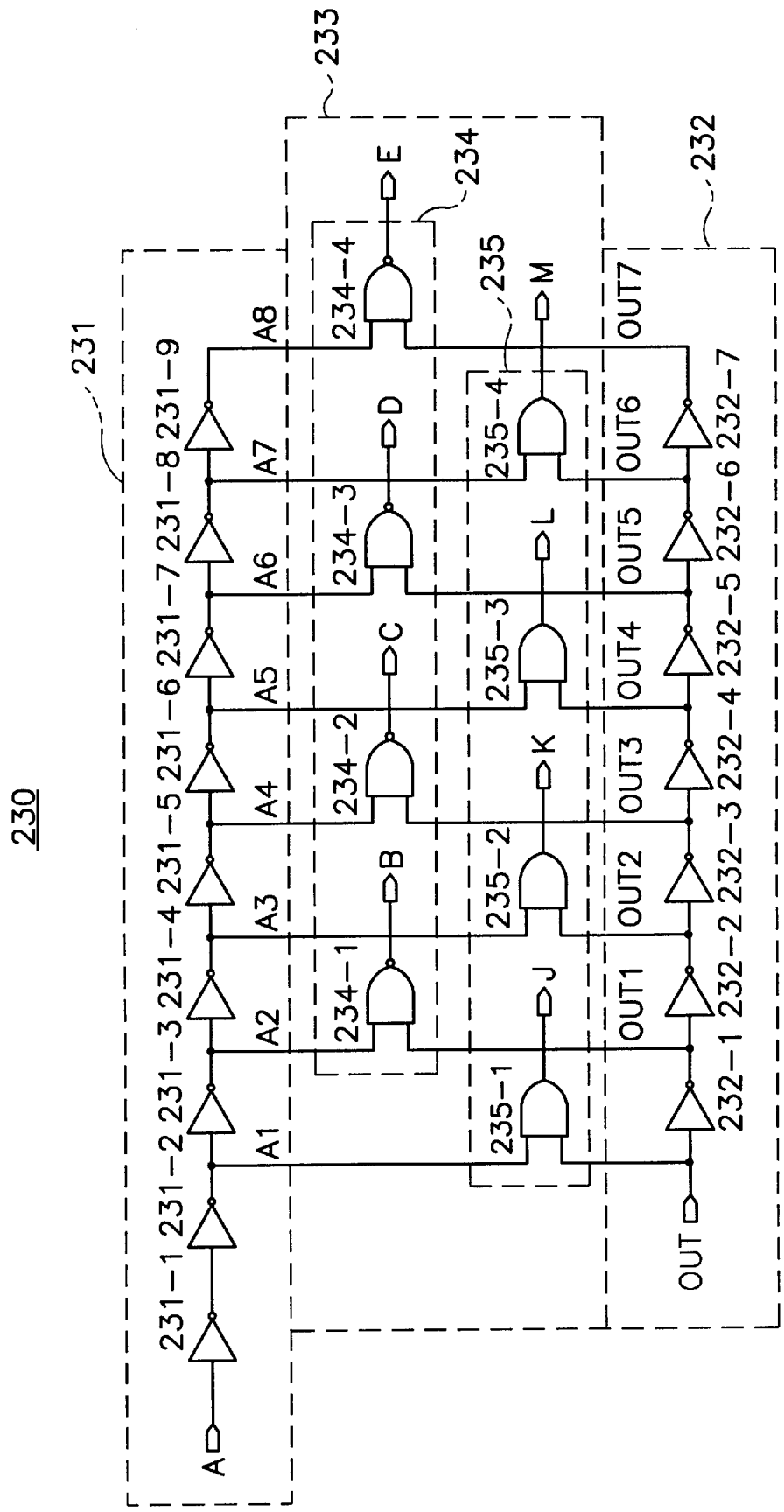
FIG. 5 is a detailed circuit diagram of a sequential driving circuit shown in FIG. 2.

FIG. 5 is a detailed circuit diagram of the sequential driving circuit 230 shown in FIG. 2. Referring to FIG. 5, the first delay section 231 includes nine inverters 231-1, 231-2, ..., 231-9 connected in series, and the second delay section 232 includes seven inverters 232-1, 232-2, ..., 232-7 connected in series. The predriving signal A is applied to the input of the inverter 231-1, and the output signal OUT is applied to the input of the inverter 232-1. The first delay section 231 receives the predriving signal A and generates a set of first delay signals A1, A2, ..., A8 in this order. Inverters 231-1 and 231-2 delay the predriving signal A so to generate the delay signal A1. Further, each of the delay signals A2, A3, ..., A8 is delayed relative to its preceding signal by the delay time of each inverter. The second delay section 232 receives the output signal OUT and sequentially generates second delay signals OUT1, OUT2, ..., OUT7, each being delayed releative to its preceding signal by the inverter delay time.

The sequential control logic section 233 includes a first sequential driver logic 234 which is composed of four NAND gates 234-1, 234-2, 234-3 and 234-4, and a second sequential driver logic 235 which is composed of four AND gates 235-1, 235-2, 235-3 and 235-4. The inputs of NAND gates 234-1 to 234-4 and the AND gates 235-1 to 235-4 are connected between the first and second delay sections 231 and 232.

The NAND gate 234-1 receives the delay signals A2 and OUT1 to generate the sequential pull-up driving signal B. The delay signals A4 and OUT3, A6 and OUT5, and A8 and OUT7 are applied to NAND gates 234-2, 234-3 and 234-4, respectively, so that the NAND gates 234-2 to 234-4 generate the sequential pull-up driving signals C, D and E, respectively, in this order.

The AND gate 235-1 receives the delay signals A1 and the output signal OUT to generate the sequential pull-down driving signal J. The delay signals A3 and OUT2, A5 and OUT4, and A7 and OUT6 are applied to AND gates 235-2, 235-3 and 235-4, respectively, so that the AND gates 235-2 to 235-4 generate the sequential pull-down driving signals K, L and M respectively, in this order.

As described hereinabove, when both the input signal IN and the enable signal EN are high, the predriving signals A and I are at the low level. In this case, the P-channel transistor MP32 within the pull-up driver section 221 is turned on first and, assuming that the output terminal 203 was set to the low level, the terminal 203 starts to charge. At this time, the output terminal 203 still remains at the low level due to a smaller current driving ability of the transistor MP32. Since the transistor MP32 is smaller than the conventional pull-up transistor in size, the transistor MP32 is turned on more quickly than the conventional pull-up transistor. Therefore, the charging of the output terminal 203 can be started earlier. Since the odd-numbered delay signals A1, A3, A5 and A7 are then low, the AND gates 235-1, 235-2, 235-3 and 235-4 generate the sequential pull-down driving signals J, K, L and M each being low, respectively. As a result, all of the N-channel MOS transistors MN31, MN32, MN33 and MN34 within the pull-down driver section 222 are turned off.

When the NAND gate 234-1 within the first sequential driver logic 234 generates the sequential pull-up driving signal B at the low level according to the predriving signal A and the output signal OUT, which are low, the P-channel MOS transistor MP33 is additionally turned on. As a result, the charging of the output terminal 203 is accelerated more. The remaining P-channel transistors MP34, MP31 and MP35 are subsequently turned on at given intervals, in this order, by the sequential pull-up driving signals C, D and E, so that the output terminal 203 is fully charged up to the power supply potential $V_{DD}$. At this time, even though the output signal OUT goes high, the AND gates 235-1 to 235-4 generate sequential pull-down driving signals each being low, respectively. Therefore, the pull-down transistors MN31 to MN35 are continue to be turned off.

Figure 6A:
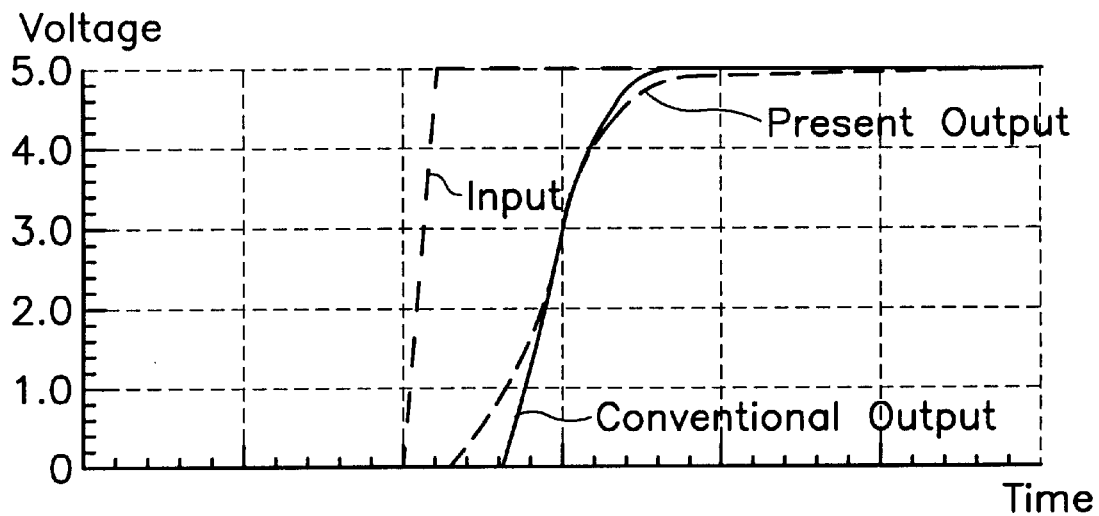
FIG. 6A is a view showing operating waveforms of the output buffer according to the present invention, compared to those of the conventional output buffer.
Figure 6B:
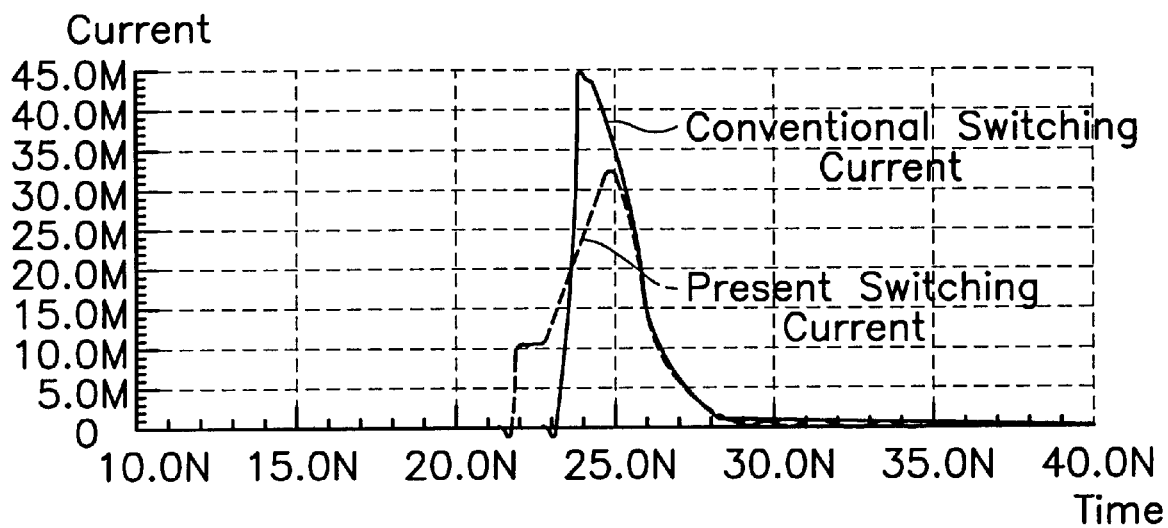
FIG. 6B is a view showing the switching current waveform of the output buffer according to the present invention, compared to that of the conventional output buffer.

In the above arrangement of this embodiment, the edge portion of the output signal OUT becomes round in comparison with that of the conventional output buffer, as shown in FIG. 6A. Since P-channel MOS transistors within pull-up driver section are also turned on in order, switching current is dispersed with respect to time, as shown in FIG. 6B. Thus, spiking of the switching current is considerably mitigated in comparison with the conventional techniques, thereby reducing switching noise.

Under the above condition, upon the input signal IN changing from the high level to the low level, the predriving signals A and I go high. In this case, the N-channel transistor MN31 within the pull-down driver section 222 is turned on first, so that the output terminal 203 starts to discharge. Since the transistor MN31 is smaller in size than the conventional pull-down transistor, the output terminal 203 begins to be discharged more quickly, in comparison to that of the conventional output buffer. Since the odd-numbered delay signals OUT1, OUT3, OUT5 and OUT7 (or the even-numbered delay signals A2, A4, A6 and A8) are then low, the NAND gates 234-1, 234-2, 234-3 and 234-4 generate the sequential pull-up driving signals B, C, D and E each being high, respectively. Consequently, all of the P-channel MOS transistors MP31, MP32, MP33 and MP34 within the first pull-up driver section 221 are turned off.

When the sequential pull-down driving signal J at the high level is generated from AND gate 235-1 within the second sequential driver logic 235, the N-channel MOS transistor MN32 is also turned on and thereby the discharging of the output terminal 203 is further accelerated. The remaining N-channel transistors MN33, MN34 and MN35 are then turned on at given intervals, in this order, by the sequential pull-down driving signals K, L and M, so that the output terminal 203 is completely discharged to the ground potential $V_{SS}$. At this time, even though the output signal OUT goes low, the NAND gates 234-1 to 234-4 generate sequential pull-up driving signals each being high, respectively. Therefore, the pull-up transistors MP31 to MP35 continue to be turned off.

As described above, since N-channel MOS transistors within pull-down driver section are turned on in order, switching current is dispersed with time as shown in FIG. 6B. Therefore, spiking of the switching current is considerably mitigated, compared to the conventional techniques, resulting in an effective reduction in switching noise.

What is claimed is:

1. A CMOS output buffer circuit comprising:
   a predriving circuit which receives an input signal and an enable signal, and which generates a first predriving signal and a second predriving signal responsive to the input signal and the enable signal;
   a sequential driving circuit which receives the first predriving signal and an output signal at an output terminal, and which generates a plurality of first sequential driving signals in order when the output signal is at a first logic level and a plurality of second sequential driving signals in order when the output signal is at a second logic level; and
   a main driving circuit which receives the first and second predriving signals and the first and second sequential signals, and which generates the output signal as either one of the first logic level and the second logic level responsive to the first and second predriving signals and the first and second sequential driving signals.

2. The CMOS output buffer circuit according to claim 1, wherein said predriving circuit comprises a logic circuit which is responsive to the input signal and the enable signal to generate a first logic signal and a second logic signal, the first and second logic signals each being at the second logic level when both the input and enable signals are at the first logic level, the first and second logic signals each being at the first logic level when the input signal is at the second logic level and the enable signal is at the first logic level, and the first logic signal being at the first logic level and the second logic signal being at the second logic level when the enable signal is at the second logic level, wherein the first and second logic signals are the first and second predriving signals, respectively.

3. The CMOS output buffer circuit according to claim 1, wherein said predriving circuit comprises:
   a logic circuit which is responsive to the input signal and the enable signal to generate a first logic signal and a second logic signal, the first and second logic signals each being at the second logic level when both the input and enable signals are at the first logic level, the first and second logic signals each being at the first logic level when the input signal is at the second logic level and the enable signal is at the first logic level, and the first logic signal being at the first logic level and the second logic signal being at the second logic level when the enable signal is at the second logic level;
   a first circuit which receives the first logic signal and generates the first predriving signal; and
   a second circuit which receives the second logic signal and generates the second predriving signal.

4. The CMOS output buffer circuit according to claim 2, wherein said logic comprises:
   a NAND gate circuit which receives the input signal and enable signal, and generates the first logic signal;
   an inverter circuit which receives the enable signal and generates an inverted enable signal; and
   a NOR gate circuit which receives the inverted enable signal and the enable signal, and generates the second logic signal.

5. The CMOS output buffer circuit according to claim 3, wherein said logic comprises:
   a NAND gate circuit which receives the input signal and enable signal, and generates the first logic signal;
   an inverter circuit which receives the enable signal and generates an inverted enable signal; and
   a NOR gate circuit which receives the inverted enable signal and the enable signal, and generates the second logic signal.

6. The CMOS output buffer circuit according to claim 1, wherein said sequential driving circuit comprises:
   a first delay which receives the first predriving signal and generates a plurality of first delay signals each being delayed relative to a preceding signal by a predetermined time;
   a second delay which receives the output signal and generates a plurality of second delay signals each being delayed relative to a preceding signal by the predetermined time;
   a first logic circuit which alternately receives the first and second delay signals, and which generates the first sequential driving signals in order; and
   a second logic circuit which alternately receives the output signal and the first and second delay signals, and which generates the second sequential driving signals in order.

7. The CMOS output buffer circuit according to claim 6, wherein said first and second delay circuits are each comprised of a plurality of series connected inverter circuits.

8. The CMOS output buffer circuit according to claim 7, wherein said first logic circuit comprises a plurality of NAND gate circuits each having one input connected to an output of a corresponding inverter circuit within said first delay circuit and another input connected to an output of a corresponding inverter circuit within said second delay circuit, said respective NAND gate circuits generating a corresponding one of the first sequential driving signals.

9. The CMOS output buffer circuit according to claim 7, wherein said second logic circuit comprises a plurality of AND gate circuits each having one input connected to an output of a corresponding inverter circuit within said first delay circuit and another input connected to an output of a corresponding inverter circuit within said second delay circuit, said respective AND gate circuits generating a corresponding one of the second sequential driving signals.

10. The CMOS output buffer circuit according to claim 1, wherein said main driving circuit comprises:
   a pull-up driver responsive to the first predriving signal and the first sequential driving signals, for making a step-by-step transition of the output signal from a ground potential to a power supply potential; and
   a pull-down driver responsive to the second predriving signal and the second sequential driving signals, for making a step-by-step transition of the output signal from the power supply potential to the ground potential.

11. The CMOS output buffer circuit according to claim 10, wherein said pull-up driver comprises a plurality of first conductivity type MOS transistors having current paths connected in parallel between the power supply potential and said output terminal, control terminals of said plurality of first conductivity type MOS transistors respectively receiving the first predriving signal and the first sequential driving signals, and wherein said pull-down driver comprises a plurality of second conductivity type MOS transistors having current paths connected in parallel between said output terminal and the ground potential, control terminals of said plurality of second conductivity type MOS transistors respectively receiving the second predriving signal and the second sequential driving signals.

12. The CMOS output buffer circuit according to claim 11, wherein said first conductivity type is p-type, and said second conductivity type is n-type.

13. A CMOS output buffer circuit comprising:
   a first circuit for receiving an input signal and enable signal and generating a first predriving signal and a second predriving signal;
   a second circuit for receiving the first predriving signal and an output signal and sequentially generating a plurality of first sequential driving signals at predetermined intervals when the input signal is at a first logic level, and sequentially generating a plurality of second sequential driving signals at the predetermined intervals when the input signal is at a second logic level; and
   a third circuit for receiving the first and second predriving signals and the first and second sequential driving signals and for generating an output signal at an output terminal, wherein said third circuit includes a plurality of first conductivity type MOS transistors which have current paths connected in parallel between a power supply potential and said output terminal and control terminals respectively receiving the first predriving signals and the first sequential driving signals, and a plurality of second conductivity type MOS transistors which have current paths connected in parallel between said output terminal and a ground potential and control terminals respectively receiving the second predriving and the second sequential driving signals, wherein the output terminal is either gradually charged up to the power supply potential or gradually discharged into the ground potential by the first and second conductivity type MOS transisitors.

14. A CMOS output buffer circuit comprising:
   a predriving circuit which receives an input signal and generates first and second predriving signals;
   a sequential driving circuit which receives an output signal and at least one of the first and second predriving signals, and which generates a plurality of sequential pull-up driving signals in order when the output signal is at a first logic level and a plurality of sequential pull-down driving signals in order when the output signal is at a second logic level; and
   a main driving circuit which receives the sequential pull-up and pull-down driving signals and generates an output signal according to the sequential pull-up and pull-down driving signals, wherein the output signal is gradually developed step by step to either one of a first logic level and a second logic level according to the sequential pull-up and pull-down driving signals.

15. A CMOS output buffer circuit as claimed in claim 14, wherein the first logic level is a power supply potential and the second logic level is a ground potential.

16. A CMOS output buffer circuit as claimed in claim 14, wherein said main driving circuit includes a plurality of parallel connected pull-up transistors having switching states controlled by the pull-up driving signals and a plurality of parallel connected pull-down transistors having switching states controlled by the pull-down driving signals.

17. A CMOS output buffer circuit as claimed in claim 15, wherein said main driving circuit includes a plurality of parallel connected pull-up transistors having switching states controlled by the pull-up driving signals and a plurality of parallel connected pull-down transistors having switching states controlled by the pull-down driving signals.

* * * * *